(12) United States Patent
Ohta et al.

(10) Patent No.: US 7,419,722 B2
(45) Date of Patent: Sep. 2, 2008

(54) HEAT-RADIATING SHEET AND HEAT-RADIATING STRUCTURE

(75) Inventors: Mitsuru Ohta, Saitama (JP); Jun Yamazaki, Tokyo (JP); Kikuo Fujiwara, Kawasaki (JP)

(73) Assignees: Polymatech Co., Ltd., Tokyo (JP); Otsuka Electric Co., Ltd., Kanagawa-ken (JP)

( * ) Notice: Subject to any disclaimer, the term of this patent is extended or adjusted under 35 U.S.C. 154(b) by 39 days.

(21) Appl. No.: 11/478,465

(22) Filed: Jun. 28, 2006

(65) Prior Publication Data

US 2007/0003721 A1 Jan. 4, 2007

(30) Foreign Application Priority Data

Jun. 30, 2005 (JP) ............................. 2005-192438

(51) Int. Cl.
*B32B 9/00* (2006.01)
(52) U.S. Cl. ....................... 428/408; 165/185
(58) Field of Classification Search ................. 428/408; 423/447.1; 165/185
See application file for complete search history.

(56) References Cited

U.S. PATENT DOCUMENTS

| 5,100,737 A | 3/1992 | Colombier et al. |
| 5,830,809 A | 11/1998 | Howard et al. |
| 5,831,374 A * | 11/1998 | Morita et al. ................. 313/46 |
| 6,835,453 B2 * | 12/2004 | Greenwood et al. ......... 428/343 |
| 2004/0067372 A1 | 4/2004 | Takei et al. |

FOREIGN PATENT DOCUMENTS

| EP | 1265281 A2 | 12/2002 |
| EP | 1536313 A2 | 6/2005 |
| JP | 7-109171 A | 4/1995 |
| JP | 11-58591 A | 3/1999 |
| JP | 2002-361772 A | 12/2002 |
| JP | 2003-168882 A | 6/2003 |
| JP | 2004-243650 A | 9/2004 |
| WO | 02/059965 A1 | 8/2002 |

* cited by examiner

*Primary Examiner*—Keith D. Hendricks
*Assistant Examiner*—Daniel Miller
(74) *Attorney, Agent, or Firm*—Crompton, Seager & Tufte, LLC

(57) ABSTRACT

A heat-radiating structure is equipped with a heat-radiating sheet, a case and exothermic bodies. Heat-radiating sheet is equipped with a graphite sheet, and an electrically insulating elastic layer provided on surface thereof. The average thickness of graphite sheet is 300 μm or less. Elastic layer is formed from an elastic composition containing a particulate heat-conducting filler. The average thickness of elastic layer is 10 to 280 μm. The average particle diameter of the heat-conducting filler is 50% or less of the average thickness of elastic layer. In the elastic composition, the content of the heat-conducting filler is 30% by volume or more, and the content of heat-conducting filler in which the average particle diameter is 95% or more of the average thickness of elastic layer is less than 15% by volume. The free space within case is less than 20% of the volume of case.

10 Claims, 1 Drawing Sheet

HEAT-RADIATING SHEET AND HEAT-RADIATING STRUCTURE

BACKGROUND OF THE INVENTION

The present invention relates to a heat-radiating sheet for dissipating heat generated from an exothermic body, and a heat-radiating structure equipped with said heat-radiating sheet.

Electronic components and other exothermic bodies present in electronic devices as exemplified by cellular telephones have come to be installed at increasingly high densities accompanying the reduced size and thinner design of these devices, while the thermal capacity of these electronic devices is decreasing. Moreover, the degree of sealing of electronic devices is also increasing accompanying improvements in waterproofing and dust-proofing of these devices. Consequently, in addition to the heat generated from exothermic bodies tending to be easily accumulated locally within electronic devices, the temperature of the case surface of electronic devices rises easily. As a result, together with exothermic bodies being susceptible to damage due to accumulation of heat, there is also greater likelihood of causing discomfort for users of such electronic devices due to the local rise in case surface temperature attributable to local accumulation of heat within such electronic devices. Consequently, it is necessary to avoid the local accumulation of heat within electronic devices, and the diffusion of heat generated from exothermic bodies is becoming an important issue.

In the past, graphite sheets were used to efficiently diffuse generated heat in confined, narrow spaces. A graphite sheet is provided on an exothermic body, and the generated heat is forced to diffuse in a direction parallel to the surface of the graphite sheet. However, graphite sheets have the problems indicated below.

(1) Since graphite sheets have a rough surface as well as large rigidity, adequate adhesion is unable to be obtained with an exothermic body even in the case where a large load is applied so as to adhere to the exothermic body. As a result, there are cases in which contact thermal resistance with the exothermic body cannot be adequately lowered. In addition, there are cases in which the application of a large load to the graphite sheet on an exothermic body has a detrimental effect on the exothermic body.

(2) The coefficient of thermal conductivity in the direction of thickness of graphite sheets can be enhanced by, for example, changing the crystal structure of the graphite within the graphite sheet in order to allow more efficient transfer of heat from an exothermic body to the graphite sheet. In this case, however, since the coefficient of thermal conductivity in a direction parallel to the surface of the graphite sheet decreases, the heat-diffusing effects of the graphite sheet are diminished.

(3) Since graphite sheets have satisfactory electrical conductivity, graphite sheets require insulating measures in cases in which it is preferable that the graphite sheet not demonstrate electrical conductivity.

(4) Since graphite sheets lack tackiness, the use of an adhesive is required to attach graphite sheets to an exothermic body. Consequently, together with the attachment of the graphite sheet to an exothermic body being bothersome, the heat-radiating effects of the graphite sheet may decrease or become unstable due to the thickness and thermal conductivity of the adhesive layer provided between the exothermic body and graphite sheet. Moreover, after a graphite sheet has been attached to an exothermic body using an adhesive, when the graphite sheet is reattached after having separated from the exothermic body for reasons such as correcting the attached location, interlayer separation occurs between the graphite layers laminated within the graphite sheet making the graphite sheet susceptible to damage. Consequently, graphite sheets have low reworkability (ease of reattachment).

Japanese Laid-Open Patent Publication No. 2003-168882 discloses a graphite sheet having high rigidity and a heat-radiating sheet equipped with a flexible polymer material layer provided on said graphite sheet in order to resolve the aforementioned problems of graphite sheets. This heat-radiating sheet aims to overcome the aforementioned problems of graphite sheets with a polymer material layer. However, the heat-radiating sheet of Japanese Laid-Open Patent Publication No. 2003-168882 is unable to adequately overcome the aforementioned problems and still has room for improvement.

SUMMARY OF THE INVENTION

Accordingly, it is an object of the present invention is to provide a heat-radiating sheet, capable of being preferably used in applications in which heat generated from an exothermic body is dissipated, and a heat-radiating structure.

To achieve the foregoing and other objectives of the present invention, a heat-radiating sheet for use with an exothermic body, the heat-radiating sheet comprising a graphite sheet and an electrically insulating elastic layer is provided. The graphite sheet is provided on the exothermic body. The electrically insulating elastic layer is provided on a surface of said graphite sheet in opposition to the exothermic body. The graphite sheet has an average thickness of 300 μm or less. The elastic layer is formed from an elastic composition containing a polymer matrix and a particulate heat-conducting filler. The elastic layer has an average thickness of 10 to 280 μm. The heat-conducting filler has an average particle diameter of 50% or less of the average thickness of the elastic layer. The elastic composition has a heat-conducting filler content of 30% by volume or more, and the elastic composition has a heat-conducting filler content of less than 15% by volume when the average particle diameter of the heat-conducting filler is 95% or more of the average thickness of the elastic layer.

The present invention also provides a heat-radiating structure comprising the heat-radiating sheet, a case, and an exothermic body provided within said case. The heat-radiating sheet is provided on the exothermic body so that the surface of the elastic layer contacts the exothermic body. The case has a volume of free space of less than 20% of the volume of the case.

Other aspects and advantages of the invention will become apparent from the following description, taken in conjunction with the accompanying drawings, illustrating by the way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE PREFERRED EMBODIMENTS

The following provides a detailed explanation of an embodiment that embodies the present invention in a heat-radiating structure based on the drawings.

Figure 1:
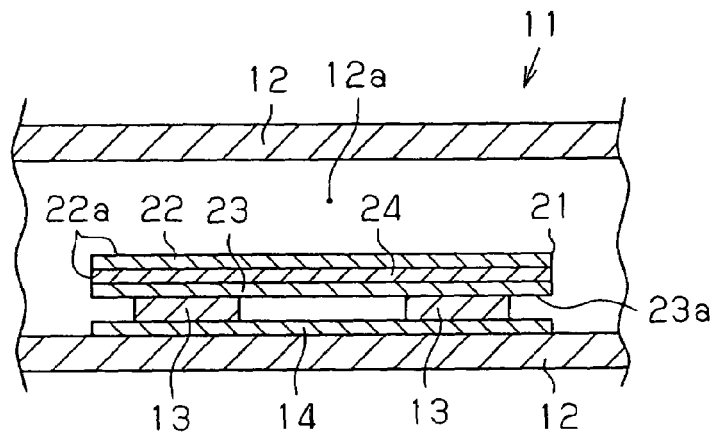
FIG. 1 is a cross-sectional view of a heat-radiating sheet of the present embodiment.

As shown in FIG. 1, a heat-radiating structure 11 of the present embodiment is equipped with a heat-radiating sheet 21, a case 12, and a plurality of exothermic bodies 13 provided within said case 12. Heat-radiating sheet 21 is equipped with a graphite sheet 22, an elastic layer 23 provided on a surface 22a of said graphite sheet 22, and a barrier layer 24 provided between graphite sheet 22 and elastic layer 23.

Graphite sheet 22 is provided on exothermic bodies 13, and heat generated from exothermic bodies 13 is dissipated while diffusing in a direction parallel to surface 22a of graphite sheet 22 to prevent accumulation of heat within and in the vicinity of exothermic bodies 13.

Examples of graphite sheet 22 include a natural graphite sheet having for its raw material natural graphite, an artificial graphite sheet having for its raw material artificial graphite, and a hybrid graphite sheet having for its raw material both natural graphite and artificial graphite. Graphite sheet 22 has both thermal conductivity and electrical conductivity. The thermal conductivity of graphite sheet 22 is mainly demonstrated in a direction parallel to surface 22a of graphite sheet 22. Namely, the coefficient of thermal conductivity in a direction parallel to surface 22a of graphite sheet 22 is 100 to 800 W/m·K, which is extremely high in comparison with the coefficient of thermal conductivity in the direction of thickness of graphite sheet 22. Consequently, graphite sheet 22 easily diffuses heat in a direction parallel to surface 22a thereof. The lower limit of the coefficient of thermal conductivity in a direction parallel to the surface of a natural graphite sheet is, for example, 100 W/m·K, while the lower limit of the coefficient of thermal conductivity in a direction parallel to the surface of an artificial graphite sheet or hybrid graphite sheet is, for example, 400 W/m·K.

The average thickness of graphite sheet 22 is 300 μm or less and preferably 80 to 130 μm. If the average thickness of graphite sheet 22 exceeds 300 μm, since graphite sheet 22 has high rigidity attributable to the material properties thereof, the flexibility of graphite sheet 22 decreases and as a result, the flexibility of heat-radiating sheet 21 decreases. If the average thickness of graphite sheet 22 is less than 80 μm, since graphite sheet 22 becomes excessively thin, it becomes brittle and tends to break easily while also having the risk of causing a decrease in the thermal capacity of graphite sheet 22.

Elastic layer 23 is formed from an elastic composition containing a polymer matrix and a particulate heat-conducting filler. Elastic layer 23 is provided over the entire surface 22a in opposition to exothermic bodies 13 on one surface 22a of graphite sheet 22. When heat-radiating sheet 21 is attached to exothermic bodies 13, elastic layer 23 is interposed between exothermic bodies 13 and graphite sheet 22, and promotes transfer of heat from exothermic bodies 13 to graphite sheet 22. Elastic layer 23 has both electrical insulating properties as well as flexibility attributable to the polymer matrix.

The polymer matrix holds the heat-conducting filler within elastic layer 23. The polymer matrix is selected corresponding to the required performance of elastic layer 23, such as heat resistance, chemical resistance, productivity or flexibility, and thermoplastic or thermosetting polymer materials are selected for use as the polymer matrix. Thermoplastic elastomers are examples of a thermoplastic polymer material, while crosslinked rubber is an example of a thermosetting polymer material.

Examples of thermoplastic elastomers include styrene-butadiene block copolymers and hydrogenated polymers thereof, styrene-isoprene block copolymers and hydrogenated polymers thereof, styrene-based thermoplastic elastomers, olefin-based thermoplastic elastomers, vinyl chloride-based thermoplastic elastomers, polyester-based thermoplastic elastomers, polyurethane-based thermoplastic elastomers and polyamide-based thermoplastic elastomers.

Examples of crosslinked rubber include natural rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorine rubber, urethane rubber, silicone rubber, polyisobutylene rubber and acrylic rubber.

Among these, at least one type selected from silicone rubber, polyisobutylene rubber and acrylic rubber is preferable since the flexibility of elastic layer 23 is high and other basic properties such as heat resistance as well as temperature characteristics and electrical reliability are high.

The heat-conducting filler enhances the thermal conductivity of elastic layer 23 by increasing the coefficient of thermal conductivity of elastic layer 23. Although there are no particular limitations on the material of the heat-conducting filler provided it allows elastic layer 23 to demonstrate electrical insulating properties, since the coefficient of thermal conductivity of elastic layer 23 is high, at least one type selected from aluminum oxide, aluminum hydroxide, boron nitride, aluminum nitride, zinc oxide, silica (silicon oxide), mica and zinc white is preferable.

The average particle diameter of the heat-conducting filler is 50% or less of the average thickness of elastic layer 23, and preferably 1 to 45% of the average thickness of elastic layer 23. If the average particle diameter of the heat-conducting filler exceeds 50% of the average thickness of elastic layer 23, surface irregularities attributable to the heat-conducting filler are formed in surface 23a of elastic layer 23 causing a decrease in smoothness of surface 23a of elastic layer 23. In the case the average particle diameter of the heat-conducting filler is less than 1% of the average thickness of elastic layer 23, since the specific surface area of the heat-conducting filler contained in the elastic composition becomes excessively large, the viscosity of the elastic composition becomes excessively high resulting in the risk of difficulty in preparing the elastic composition and forming elastic layer 23. The shape of the heat-conducting filler particles is preferably spherical. This is because, in addition to secondary aggregation of the heat-conducting filler in the elastic composition being inhibited, increases in viscosity of the elastic composition are inhibited, while the formation of surface irregularities attributable to the shape of the heat-conducting filler in surface 23a of elastic layer 23 is also inhibited.

The content of the heat-conducting filler in the elastic composition is 30% by volume or more and preferably 40 to 75% by volume. If the content of the heat-conducting filler is less than 30% by volume, since the content of the heat-conducting filler in elastic layer 23 is excessively low, the coefficient of thermal conductivity of elastic layer 23 decreases and the thermal conductivity of elastic layer 23 decreases. If the content of the heat-conducting filler exceeds 75% by volume, in addition to the flexibility of elastic layer 23 decreasing, there is also the risk of a decrease in the smoothness of surface 23a of elastic layer 23.

Moreover, the content in the elastic composition of a heat-conducting filler for which the average particle diameter is 95% or more of the average thickness of elastic layer 23 (hereinafter referred to as the large-diameter filler) is less than 15% by volume. If the content of the large-diameter filler is 15% by volume or more, since large surface irregularities attributable to the large-diameter filler are formed in surface 23a of elastic layer 23, the smoothness of surface 23a of elastic layer 23 decreases considerably. The less the content of the large-diameter filler is, the more the smoothness of surface 23a of elastic layer 23 increases. Thus, the elastic composition preferably does not contain large-diameter filler. In addition to each of the aforementioned components, the elastic composition may also contain, for example, a stabilizer for enhancing the durability of elastic layer 23.

The hardness of elastic layer 23 is preferably 40 or less and more preferably 30 or less. If the hardness of elastic layer 23 exceeds 40, there is the risk of elastic layer 23 being unable to demonstrate sufficient flexibility. There are no particular limitations on the lower limit of the hardness of elastic layer 23. If the hardness of elastic layer 23 is 30 or less, elastic layer 23 has suitable tackiness. The hardness of elastic layer 23 is measured with a Type A Durometer in compliance with International Standards ISO 7619-1 (Japanese Industrial Standard JIS K 6253).

The average thickness of elastic layer 23 is 10 to 280 μm and preferably 20 to 170 μm. If the average thickness of elastic layer 23 is less than 10 μm, since elastic layer 23 is excessively thin, elastic layer 23 is unable to adequately follow the surface shape of exothermic bodies 13 and as a result, the ability of heat-radiating sheet 21 to follow the surface shape of exothermic bodies 13 decreases resulting in an increase in the contact thermal resistance of heat-radiating sheet 21. Moreover, there are cases in which heat-radiating sheet 21 demonstrates electrical conductivity. If the average thickness of elastic layer 23 exceeds 280 μm, since the amount of time required for heat generated from exothermic bodies 13 to be transferred to graphite sheet 22 becomes longer, the heat radiation efficiency of heat-radiating sheet 21 decreases. Moreover, the load applied to exothermic bodies 13 by heat-radiating sheet 21 may increase, or the space for installing heat-radiating sheet 21 within case 12 may become larger.

Figure 2:
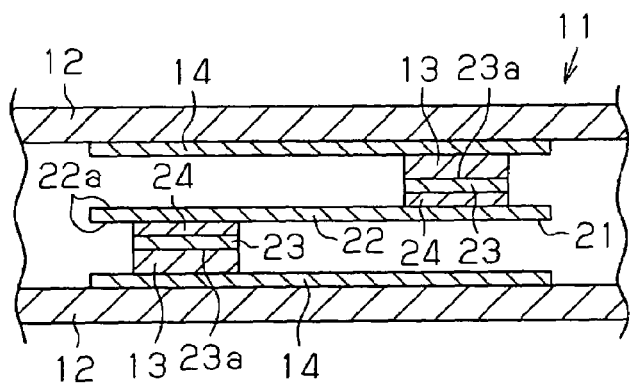
FIG. 2 is a cross-sectional view of a heat-radiating sheet.

Although elastic layer 23 of the present embodiment is provided over the entire graphite sheet 22, there are no particular limitations on the relationship between the size of elastic layer 23 and the size of graphite sheet 22, and as shown in FIG. 2, elastic layer 23 may be smaller than graphite sheet 22. At this time, elastic layer 23 is provided at the location corresponding to exothermic bodies 13 on surface 22a of graphite sheet 22. Similarly, although there are also no particular limitations on the relationship between the size of elastic layer 23 and the size of exothermic bodies 13, since elastic layer 23 is able to efficiently transfer heat from exothermic bodies 13 to graphite sheet 22, it is preferably provided at least over the entirety of exothermic bodies 13. Moreover, a plurality of elastic layers 23 may be provided on surface 22a of graphite sheet 22. For example, in the case a plurality of exothermic bodies are provided on both sides of a single heat-radiating sheet 21, elastic layer 23 is provided at those locations corresponding to exothermic bodies 13 on each surface 22a of heat-radiating sheet 21. In this case, the heat of a plurality of exothermic bodies 13 is dissipated by a single heat-radiating sheet 21.

Barrier layer 24 inhibits the movement of the polymer matrix in elastic layer 23 towards graphite sheet 22. Moreover, in addition to enhancing adhesion between graphite sheet 22 and elastic layer 23, barrier layer 24 enhances the electrical insulating properties of elastic layer 23 by being formed from an electrical insulating material. Examples of the material of barrier layer 24 include polyethylene terephthalate, polyurethane, polyamide, polycarbonate and alloys thereof. The material of barrier layer 24 is preferably selected corresponding to the aforementioned polymer matrix. More specifically, in the case the polymer matrix is silicone rubber or polyisobutylene rubber, barrier layer 24 is preferably formed from an acrylic resin material, while in the case the polymer matrix is acrylic rubber, barrier layer 24 is preferably formed from a silicone-based resin material.

The average thickness of barrier layer 24 is preferably 10 μm or less. If the average thickness of barrier layer 24 exceeds 10 μm, the transfer of heat from elastic layer 23 to graphite sheet 22 is easily inhibited by barrier layer 24. There are no particular limitations on the lower limit of the average thickness of barrier layer 24.

Heat-radiating sheet 21 is produced by laminating graphite sheet 22, barrier layer 24 and elastic layer 23 in that order. There are no particular limitations on the method used to laminate graphite sheet 22 and layers 23 and 24, and each layer 23 and 24 may be laminated in that order on graphite sheet 22 by crimping or fusing after having separately formed graphite sheet 22 and each layer 23 and 24, or each layer 23 and 24 may be formed in order on surface 22a of graphite sheet 22.

In addition to composing a cellular telephone or other electronic device, case 12 has sealability. A substrate 14, for example, is arranged within case 12 in addition to exothermic bodies 13. The volume of the free space 12a within case 12, namely the gap within case 12, is less than 20% of the volume of case 12. If the volume of free space 12a within case 12 is equal to or greater than 20% of the volume of case 12, since case 12 becomes large, it is not possible to achieve reduced size for the electronic device and so forth.

Exothermic bodies 13 are mounted on, for example, substrate 14. Examples of exothermic bodies 13 include semiconductor devices and other electronic components, power supplies and light sources. The heat density of exothermic bodies 13 is normally 1 W/mm$^2$ or more.

When attaching heat-radiating sheet 21 to exothermic bodies 13, heat-radiating sheet 21 is placed on exothermic bodies 13 so that surface 23a of elastic layer 23 contacts exothermic bodies 13. The heat generated from exothermic bodies 13 is transferred to graphite sheet 22 via elastic layer 23 and barrier layer 24. At this time, the heat-conducting filler within elastic layer 23 promotes the transfer of heat to graphite sheet 22. The heat that has been transferred to graphite sheet 22 is diffused in a direction parallel to surface 22a of graphite sheet 22 while also being dissipated from graphite sheet 22.

The following provides a description of the effects demonstrated by the aforementioned embodiment.

Heat-radiating sheet 21 of the present embodiment is equipped with graphite sheet 22 and elastic layer 23. The thermal conductivity of graphite sheet 22 is mainly demonstrated in a direction parallel to surface 22a of graphite sheet 22. Elastic layer 23 is equipped with a heat-conducting filler, and the content of the heat-conducting filler is 30% by volume or more. Moreover, the upper limit of the average thickness of elastic layer 23 is 280 μm. Consequently, heat generated from exothermic bodies 13 is efficiently transferred to graphite sheet 22 and then diffused in a direction parallel to surface 22a of graphite sheet 22, while also being dissipated from graphite sheet 22. Thus, heat-radiating sheet 21 is able to efficiently diffuse heat generated from exothermic bodies 13, thereby making it possible to avoid local accumulation of heat within an electronic device and so forth.

The average thickness of graphite sheet 22 is 300 μm or less, and elastic layer 23 is provided with flexibility attributable to a polymer matrix. Consequently, heat-radiating sheet 21 is able to demonstrate superior flexibility. Moreover, elastic layer 23 has suitable tackiness attributable to the polymer matrix. Consequently, in addition to demonstrating superior handling and reworkability, heat-generating sheet 21 is also able to demonstrate satisfactory adhesion with exothermic bodies 13.

Since the average particle diameter of the heat-conducting filler is 50% or less of the average thickness of the aforementioned elastic layer 23, and the content of heat-conducting filler in which the average particle diameter is 95% or more of the average thickness of elastic layer 23 is less than 15% by volume, surface 23a of elastic layer 23 has a high degree of smoothness. Moreover, since the lower limit of the average thickness of elastic layer 23 is 10 μm, the ability of elastic layer 23 to follow the surface shape of exothermic bodies 13 is high. Thus, heat-radiating sheet 21 is able to adequately lower contact thermal resistance with exothermic bodies 13, thereby enabling it to radiate heat from exothermic bodies 13 without applying a large load.

Since the polymer matrix within elastic layer 23 is inhibited from moving towards graphite sheet 22 by barrier layer 24, changes in the thickness and hardness of elastic layer 23 caused by said movement can be inhibited. Consequently, the productivity and storage properties of heat-radiating sheet 21 can be stabilized.

The heat-generating structure 11 of the present embodiment is equipped with heat-radiating sheet 21, and the volume of free space 12a within case 12 is less than 20% of the volume of case 12. Consequently, this heat-radiating structure 11 is able to achieve reduced size and thickness of an electronic device composed by case 12 while simultaneously avoiding local accumulation of heat.

The aforementioned embodiment can be embodied by alterations in the manner described below.

An aluminum foil layer may also be provided on surface 23a of graphite sheet 22. In this case, the aluminum foil layer may be provided only on one surface 22a of graphite sheet 22 or it may be provided on both surfaces 22a. Moreover, the aluminum foil layer may be provided over the entire graphite sheet 22, or it may be provided only over a portion of graphite sheet 22. An aluminum foil layer provided between graphite sheet 22 and barrier layer 24 promotes the transfer of heat from exothermic bodies 13 to graphite sheet 22. An aluminum foil layer provided at a location other than where barrier layer 24 and elastic layer 23 are provided on graphite sheet 22 promotes the radiation of heat from graphite sheet 22. Moreover, the aluminum foil layer acts as a reinforcing material for graphite sheet 22, and for example, is able to inhibit breaking of graphite sheet 22 or separation from heat-radiating sheet 21 during handling or bending of heat-radiating sheet 21.

Elastic layer 23 may also be equipped with a fibrous heat-conducting filler (hereinafter referred to as a fibrous filler). Examples of materials of this fibrous filler include carbon, metal nitrides, metal oxides, metal carbonate and metal hydroxides. Since the fibrous filler has a high coefficient of thermal conductivity in the direction of thickness of elastic layer 23, it is preferably oriented along the direction of thickness of elastic layer 23. Examples of methods for orienting the fibrous filler include methods in which a magnetic field, electrical field or vibrations are applied to the elastic composition.

Barrier layer 24 may also be omitted.

A cooling member such as a heat sink may also be mounted on heat-radiating sheet 21. In this case, the efficiency at which heat is radiated from exothermic bodies 13 can be enhanced.

Surface treatment that improves the adhesion of graphite sheet 22 may be carried out on surface 23a of graphite sheet 22. Examples of this surface treatment include coronal discharge, ultraviolet light treatment and coupling agent treatment.

The following provides a more detailed explanation of the aforementioned embodiment through examples and comparative examples.

Examples 1-13 and Comparative Examples 1-14

In Example 1, after preparing an elastic composition by mixing a heat-conducting filler in the form of spherical alumina (Micron Co. Ltd, average particle size: 3.5 μm) into a polymer matrix in the form of silicone gel (Dow Corning Toray Co., Ltd, CY52-291), an elastic layer 23 was formed from said elastic composition. In addition, a polyacrylate composition was prepared by mixing 2 parts by weight of a curing agent (Kaneka Corp, CR500), 1 part by weight of anti-aging agent and 0.05 parts by weight of a catalyst into 100 parts by weight of an acrylic-based resin material in the form of polyacrylate (Kaneka Corp, SA100A). Next, the polyacrylate composition was coated onto one surface 22a of a graphite sheet 22 (GrafTech International Ltd.), and a barrier layer 24 was formed by heating and curing the polyacrylate composition. Elastic layer 23 was laminated on barrier layer 24 by crimping to obtain a heat-radiating sheet 21. The average particle diameter of the heat-conducting filler, the content of heat-conducting filler in which the average particle diameter is 95% or more of the average thickness of elastic layer 23, the content of the heat-conducting filler in the elastic composition, and the average thicknesses of graphite sheet 22 and layers 23 and 24 are shown in Table 1.

In Examples 2 to 13, heat-radiating sheets 21 were obtained in the same manner as Example 1 with the exception of altering the particle diameter of the heat-conducting filler and so forth as shown in Tables 1 and 2.

In Comparative Examples 1 to 13, heat-radiating sheets 21 were obtained in the same manner as Example 1 with the exception of altering the average particle diameter of the heat-conducting filler and so forth as shown in Tables 3 and 4. In Tables 1 to 4, each of the values in the row entitled "Proportion having particle diameter of 95% or more" indicates the content of heat-conducting filler in which the average particle diameter is 95% or more of the average thickness of elastic layer 23, while each of the values in the row entitled "Content" indicates the content of heat-conducting filler in the elastic composition. In Tables 3 and 4, a "–" sign in the row entitled "Average particle diameter" and so forth in the column entitled "Heat-conducting filler" indicates that elastic layer 23 is not provided with a heat-conducting filler. A "–" sign in the row entitled "Graphite sheet" and so forth in the column entitled "Average thickness" indicates that heat-radiating sheet 21 is not provided with a graphite sheet and so forth. Each of the following parameters were measured or evaluated for each of the examples of heat-radiating sheets 21. Those results are shown in Tables 1 to 4.

Elastic Layer Hardness

The hardness of elastic layer 23 was measured for heat-radiating sheets 21 having an elastic layer 23 using a Type A Durometer in compliance with ISO 7619-1.

Coefficient of Thermal Conductivity

After obtaining disc-shaped test pieces (diameter: 10 mm) from graphite sheet 22 and elastic layer 23 of each example, the coefficients of thermal conductivity of the test pieces were measured according to the laser flash method using a thermal constant measurement system (Rigaku Corp., LF/TCM-FA8510B). Coefficients of thermal conductivity were measured in both the direction parallel to the surface of the test piece and the direction of thickness of the test piece for test pieces obtained from graphite sheet 22. Coefficients of thermal conductivity were measured in the direction of thickness of the test piece for test pieces obtained from elastic layer 23. The coefficients of thermal conductivity in the direction parallel to the surface of the test pieces obtained from graphite sheet 22 are indicated in the row entitled "Graphite sheet (surface)", the coefficients of thermal conductivity in the direction of thickness of the test pieces obtained from graphite sheet 22 are indicated in the row entitled "Graphite sheet (thickness)", and the coefficients of thermal conductivity in the direction of thickness of the test pieces obtained from elastic layer 23 are indicated in the row entitled "Elastic layer".

Thermal Resistance

The heat-radiating sheet 21 of each example was interposed between a ceramic heater (SAKAGUCHI E.H VOC CORP, Microceramic Heater MS-3, calorific value: 25 W, top surface: 10 mm high×10 mm wide) and a cooling member in the form of a heat sink, followed by applying a load of 10 N/cm² to heat-radiating sheet 21 with a press. Next, the ceramic heater was turned on and heat-radiating sheet was allowed to stand for 10 minutes. After 10 minutes had elapsed, the temperature of surface 22a on the side of the ceramic heater and the temperature of surface 22a on the side of the heat sink were measured for heat-radiating sheet 21 to determine the value of thermal resistance using the equation below. In the equation, $\theta_{j1}$ indicates the temperature of surface 22a on the side of the ceramic heater, and $\theta_{j0}$ indicates the temperature of surface 22a on the side of the heat sink.

Thermal resistance (° C./W)=$(\theta_{j1}-\theta_{j0})$/calorific value of ceramic heater (W)

Volume Resistivity

The volume resistivity of the heat-radiating sheet 21 of each example was measured in compliance with International Standards IEC 60093 (JIS K 6911).

Thermal Diffusion

Figure 3A:
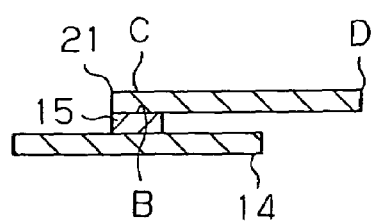
FIG. 3A is a plan view of a ceramic heater and a heat-radiating sheet.
Figure 3B:
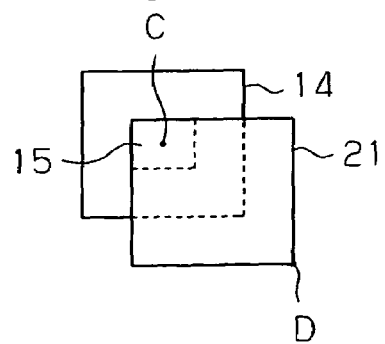
FIG. 3B is a cross-sectional view of a ceramic heater and a heat-radiating sheet.

As shown in FIGS. 3A and 3B, after attaching the heat-radiating sheet 21 of each example to a ceramic heater 15 (SAKAGUCHI E.H VOC CORP, Microceramic Heater MS-3, calorific value: 9 W, top surface: 10 mm high×10 mm wide), the ceramic heater was turned on and the heat-radiating sheet 21 was allowed to stand for 10 minutes. Next, after 10 minutes had elapsed, the temperature at center B on the top surface of ceramic heater 15 was measured. Moreover, in addition to measuring the temperature at a location C corresponding to the aforementioned center B on the surface of a side of heat-radiating sheet 21 not opposing ceramic heater 15, the temperature at a location D 280 mm away from the center of ceramic heater 15 was measured. Each temperature difference was determined using the following equations from the temperatures at center B and locations C and D. In addition, in Comparative Example 14, the temperature at the aforementioned center B of ceramic heater 15 was measured after allowing to stand for 10 minutes while omitting heat-radiating sheet 21.

$\Delta T_1$(° C.)=(temperature at center $B$(° C.))−(temperature at location $C$(° C.))

$\Delta T_2$(° C.)=(temperature at location $C$(° C.))−(temperature at location $D$(° C.))

Flexibility

Flexibility was evaluated for heat-radiating sheet 21 of each example based on the hardness and so forth thereof. In the row entitled "Flexibility" of each table, a "3" indicates that heat-radiating sheet 21 demonstrates superior flexibility, and that wrinkles or cracks do not form in the surface of heat-radiating sheet 21 even if it is bent. A "2" indicates that heat-radiating sheet 21 demonstrates satisfactory flexibility, and that wrinkles and cracks do not form in the surface of heat-radiating sheet 21 during normal use of heat-radiating sheet 21. An "1" indicates that heat-radiating sheet 21 has low flexibility, and that wrinkles and cracks form easily in the surface of heat-radiating sheet 21.

Shape Following

The ability of the heat-radiating sheet of each example to follow the surface shape of ceramic heater 15 was evaluated when each heat-radiating sheet 21 was attached to ceramic heater 15 in the evaluation of thermal diffusion. In the row entitled "Shape following" of each table, a "3" indicates that heat-radiating sheet 21 demonstrates excellent shape following, and that the contact thermal resistance of heat-radiating sheet 21 is extremely low. A "2" indicates that heat-radiating sheet 21 demonstrates satisfactory shape following, and that the contact thermal resistance of heat-radiating sheet 21 is low. An "1" indicates that heat-radiating sheet 21 has low shape following, and that the contact thermal resistance of heat-radiating sheet 21 is high.

Tackiness

The tackiness of the surface on the side of ceramic heater 15 was evaluated for the heat-radiating sheet 21 of each example. In the row entitled "Tackiness" of each table, a "3" indicates that heat-radiating sheet 21 has tackiness to the degree that it is able to demonstrate superior reworkability. A "2" indicates that heat-radiating sheet 21 has slight tackiness to the degree that it is able to demonstrate satisfactory reworkability. An "1" indicates that, although heat-radiating sheet 21 has tackiness, since the tackiness of heat-radiating sheet 21 is low, it does not demonstrate reworkability.

Surface Smoothness

The smoothness of the surface on the side of ceramic heater 15 was evaluated for the heat-radiating sheet 21 of each example. In the row entitled "Surface smoothness" of each table, a "3" indicates that the surface of heat-radiating sheet 21 has a high degree of smoothness, while a "2" indicates that the surface of heat-radiating sheet 21 has satisfactory smoothness. An "1" indicates that the surface smoothness of heat-radiating sheet 21 is low, and that protrusions attributable to the heat-conducting filler and surface defects such as indentations attributable to separation of the heat-conducting filler are conspicuous on the surface of heat-radiating sheet 21.

Handling

The heat-radiating sheet 21 of each example was evaluated for handling. In the row entitled "Handling" of each table, a "3" indicates that the handling of heat-radiating sheet 21 is extremely easy, a "2" indicates that the handling of heat-radiating sheet 21 is easy, and an "1" indicates that the handling of heat-radiating sheet 21 is difficult, and that attachment of heat-radiating sheet 21 at a desired location is difficult.

TABLE 1

|  |  | Ex. 1 | Ex. 2 | Ex. 3 | Ex. 4 | Ex. 5 | Ex. 6 | Ex. 7 |
|---|---|---|---|---|---|---|---|---|
| Heat-conducting filler | Average particle diameter (μm) | 3.5 | 3.5 | 3.5 | 8 | 3.5 | 10 | 3.5 |
|  | Proportion having particle diameter of 95% or more (%) | 0.1 | 0 | 0 | 0 | 0 | 0 | 0 |
|  | Content (vol %) | 54 | 54 | 54 | 71 | 54 | 67 | 67 |
| Average thickness (μm) | Graphite sheet | 80 | 80 | 80 | 80 | 80 | 130 | 130 |
|  | Barrier layer | 5 | 5 | 5 | 5 | 5 | 5 | 5 |
|  | Elastic layer | 20 | 120 | 280 | 120 | 120 | 120 | 100 |
| Elastic layer hardness (type A) |  | 23 | 23 | 23 | 26 | 40 | 24 | 24 |
| Coefficient of thermal conductivity (W/m · K) | Graphite sheet (surface) | 240 | 240 | 240 | 240 | 240 | 240 | 500 |
|  | Graphite sheet (thickness) | 7 | 7 | 7 | 7 | 7 | 7 | 5 |
|  | Elastic layer | 1.5 | 1.5 | 1.5 | 8 | 1.5 | 3 | 3 |
| Thermal resistance (° C./W) |  | 0.77 | 0.92 | 1.45 | 0.50 | 1.48 | 1.08 | 0.95 |
| Volume resistivity (Ω · cm) |  | $1.0 \times 10^{10}$ | $1.0 \times 10^{10}$ or more | $1.0 \times 10^{10}$ or more | $1.0 \times 10^{10}$ or more | $1.0 \times 10^{10}$ or more | $1.0 \times 10^{10}$ or more | $1.0 \times 10^{10}$ or more |
| Thermal diffusion | Temperature at center B (° C.) | 106.1 | 105.4 | 106.3 | 97.7 | 106.5 | 102.3 | 100.9 |
|  | ΔT1 (° C.) | 9.3 | 10.1 | 12.3 | 7.2 | 11.2 | 9.8 | 9.6 |
|  | ΔT2 (° C.) | 33.1 | 33.3 | 32.9 | 33.4 | 33.5 | 33.3 | 28.8 |
| Flexibility |  | 3 | 3 | 3 | 3 | 3 | 3 | 3 |
| Shape following |  | 2 | 3 | 3 | 3 | 2 | 3 | 3 |
| Tackiness |  | 3 | 3 | 3 | 3 | 3 | 3 | 3 |
| Surface smoothness |  | 2 | 3 | 3 | 3 | 3 | 3 | 3 |
| Handling |  | 2 | 3 | 3 | 3 | 3 | 3 | 3 |

TABLE 2

|  |  | Ex. 8 | Ex. 9 | Ex. 10 | Ex. 11 | Ex. 12 | Ex. 13 |
|---|---|---|---|---|---|---|---|
| Heat-conducting filler | Average particle diameter (μm) | 8 | 45 | 45 | 3.5 | 8 | 3.5 |
|  | Proportion having particle diameter of 95% or more (%) | 0 | 0 | 13 | 0 | 0 | 0 |
|  | Content (vol %) | 71 | 67 | 67 | 54 | 71 | 54 |
| Average thickness (μm) | Graphite sheet | 130 | 130 | 130 | 80 | 80 | 80 |
|  | Barrier layer | 5 | 5 | 5 | 5 | 5 | 15 |
|  | Elastic layer | 170 | 100 | 100 | 120 | 120 | 120 |
| Elastic layer hardness (type A) |  | 26 | 25 | 26 | 60 | 72 | 23 |
| Coefficient of thermal conductivity (W/m · K) | Graphite sheet (surface) | 500 | 500 | 500 | 240 | 240 | 240 |
|  | Graphite sheet (thickness) | 5 | 5 | 5 | 7 | 7 | 7 |
|  | Elastic layer | 8 | 3 | 3 | 1.5 | 8 | 1.5 |
| Thermal resistance (° C./W) |  | 0.75 | 0.98 | 1.02 | 1.92 | 1.67 | 1.23 |
| Volume resistivity (Ω · cm) |  | $1.0 \times 10^{10}$ or more | $1.0 \times 10^{10}$ or more | $1.0 \times 10^{10}$ or more | $1.0 \times 10^{10}$ or more | $1.0 \times 10^{10}$ or more | $1.0 \times 10^{10}$ or more |
| Thermal diffusion | Temperature at center B (° C.) | 98.8 | 101.0 | 101.2 | 110.6 | 109.6 | 110.2 |
|  | ΔT1 (° C.) | 7.8 | 10.0 | 10.8 | 12.6 | 11.5 | 13.0 |
|  | ΔT2 (° C.) | 29.3 | 28.7 | 29.1 | 33.7 | 33.5 | 32.9 |
| Flexibility |  | 3 | 3 | 3 | 2 | 2 | 3 |
| Shape following |  | 3 | 3 | 3 | 2 | 2 | 3 |
| Tackiness |  | 3 | 3 | 3 | 2 | 2 | 3 |
| Surface smoothness |  | 3 | 3 | 3 | 3 | 3 | 3 |
| Handling |  | 3 | 3 | 3 | 3 | 3 | 3 |

TABLE 3

|  |  | C. Ex. 1 | C. Ex. 2 | C. Ex. 3 | C. Ex. 4 | C. Ex. 5 | C. Ex. 6 | C. Ex. 7 |
|---|---|---|---|---|---|---|---|---|
| Heat-conducting filler | Average particle diameter (μm) | — | — | 3.5 | 3.5 | — | — | 55 |
|  | Proportion having particle diameter of 95% or more (%) | — | — | 0 | 0 | — | — | 17 |
|  | Content (vol %) | — | — | 54 | 27 | — | — | 54 |
| Average thickness (μm) | Graphite sheet | 130 | 510 | 510 | 80 | 130 | 130 | 80 |
|  | Barrier layer | 5 | 5 | 5 | 5 | 5 | 5 | 5 |
|  | Elastic layer | — | — | 80 | 120 | — | — | 120 |
| Elastic layer hardness (type A) |  | — | — | 23 | 23 | — | — | 23 |
| Coefficient of thermal conductivity (W/m·K) | Graphite sheet (surface) | 240 | 240 | 240 | 240 | 500 | 120 | 240 |
|  | Graphite sheet (thickness) | 7 | 7 | 7 | 7 | 5 | 16 | 7 |
|  | Elastic layer | — | — | 1.5 | 0.3 | — | — | 1.5 |
| Thermal resistance (°C./W) |  | 0.80 | 3.88 | 1.71 | 3.16 | 1.09 | 0.55 | 1.11 |
| Volume resistivity (Ω·cm) |  | $1.0 \times 10^2$ | $1.0 \times 10^2$ | $1.0 \times 10^{10}$ or more | $1.0 \times 10^{10}$ or more | $1.0 \times 10^2$ | $1.0 \times 10^2$ | $1.0 \times 10^{10}$ or more |
| Thermal diffusion | Temperature at center B (°C.) | 108.7 | 106.5 | 105.9 | 109.8 | 107.6 | 111.3 | 109.8 |
|  | ΔT1 (°C.) | 10.8 | 15.1 | 13.5 | 12.3 | 11.1 | 8.5 | 11.2 |
|  | ΔT2 (°C.) | 32.9 | 33.4 | 32.7 | 33.5 | 28.9 | 49.3 | 33.0 |
| Flexibility |  | 3 | 1 | 1 | 1 | 3 | 2 | 3 |
| Shape following |  | 1 | 1 | 3 | 3 | 1 | 1 | 1 |
| Tackiness |  | 1 | 1 | 3 | 3 | 1 | 1 | 3 |
| Surface smoothness |  | 2 | 2 | 3 | 3 | 2 | 2 | 1 |
| Handling |  | 2 | 2 | 3 | 3 | 2 | 2 | 3 |

TABLE 4

|  |  | C. Ex. 8 | C. Ex. 9 | C. Ex. 10 | C. Ex. 11 | C. Ex. 12 | C. Ex. 13 | C. Ex. 14 |
|---|---|---|---|---|---|---|---|---|
| Heat-conduction filler | Average particle diameter (μm) | 2 | — | — | 10 | 60 | 45 | — |
|  | Proportion having particle diameter of 95% or more (%) | 4 | — | — | 0 | 0 | 22 | — |
|  | Content (vol %) | 46 | — | — | 67 | 67 | 67 | — |
| Average thickness (μm) | Graphite sheet | 100 | 200 | 300 | — | 130 | 130 | — |
|  | Barrier layer | 3 | 5 | 5 | — | 5 | 5 | — |
|  | Elastic layer | 8 | — | — | 200 | 100 | 100 | — |
| Elastic layer hardness (type A) |  | — | — | — | 24 | 27 | 27 | — |
| Coefficient of thermal conductivity (W/m·K) | Graphite sheet (surface) | 240 | 240 | 240 | — | 500 | 500 | — |
|  | Graphite sheet (thickness) | 7 | 7 | 7 | — | 5 | 5 | — |
|  | Elastic layer | 1.0 | — | — | 3 | 3 | 3 | — |
| Thermal resistance (°C./W) |  | 0.98 | 1.65 | 2.11 | 0.45 | 1.29 | 1.31 | — |
| Volume resistivity (Ω·cm) |  | $1.0 \times 10^4$ | $1.0 \times 10^2$ | $1.0 \times 10^2$ | $1.0 \times 10^{10}$ or more | $1.0 \times 10^{10}$ or more | $1.0 \times 10^{10}$ or more | — |
| Thermal diffusion | Temperature at center B (°C.) | 109.1 | 107.8 | 106.9 | 123.7 | 108.1 | 108.3 | 127.1 |
|  | ΔT1 (°C.) | 10.5 | 11.7 | 13.1 | 6.5 | 11.5 | 12.0 | — |
|  | ΔT2 (°C.) | 34.2 | 34.4 | 34.3 | 83.4 | 28.5 | 28.6 | — |
| Flexibility |  | 3 | 3 | 2 | 3 | 3 | 3 | — |
| Shape following |  | 1 | 1 | 1 | 3 | 1 | 1 | — |
| Tackiness |  | 3 | 1 | 1 | 3 | 3 | 3 | — |
| Surface smoothness |  | 2 | 2 | 2 | 3 | 1 | 1 | — |
| Handling |  | 2 | 2 | 2 | 1 | 3 | 3 | — |

As shown in Tables 1 and 2, superior results and evaluations were obtained for all parameters with respect to Examples 1 to 13. Consequently, the heat-radiating sheet 21 of each example can be preferably used in applications for dissipating heat generated from exothermic bodies 13.

As shown in Tables 3 and 4, since heat-radiating sheet 21 is not provided with an elastic layer 23 in Comparative Examples 1, 2, 5, 6, 9 and 10, parameters such as the shape following of heat-radiating sheet 21 were inferior as compared to each of the examples. In Comparative Example 3, since the average thickness of graphite sheet 22 exceeds 300 μm, flexibility was inferior as compared with each of the examples. In Comparative Example 4, since the content of the heat-conducting filler is less than 30% by volume, the coefficient of thermal conductivity of elastic layer 23 was low, and heat accumulated within ceramic heater 15 as compared with each of the examples. In Comparative Examples 7 and 13, since the content of heat-conducting filler in which the average particle diameter was 95% or more of the average thickness of elastic layer 23 exceeds 15% by volume, the surface smoothness of heat-radiating sheet 21 was inferior as compared with each of the examples. In Comparative Example 8, since the average thickness of elastic layer 23 is less than 10 μm, the shape following of heat-radiating sheet 21 was inferior as compared with each of the examples. In Comparative Example 11, since heat-radiating sheet 21 is not provided with graphite sheet 22, heat accumulated in ceramic heater 15 as compared with each of the examples. In Comparative Example 12, since the average particle diameter of the heat-conducting filler exceeds 50% of the average thickness of elastic layer 23, the surface smoothness of heat-radiating sheet 21 was inferior as compared with each of the examples. In Comparative Example 14, since heat-radiating sheet 21 is not attached to ceramic heater 15, heat accumulated in ceramic heater 15 as compared with each of the examples.

The present examples and embodiments are to be considered as illustrative and not restrictive and the invention is not to be limited to the details given herein, but may be modified within the scope and equivalence of the appended claims.

The invention claimed is:

1. A heat-radiating sheet for use with an exothermic body, the heat-radiating sheet comprising:
   a graphite sheet provided on the exothermic body;
   an electrically insulating elastic layer provided on a surface of said graphite sheet in opposition to the exothermic body; and
   a barrier layer provided between the graphite sheet and the elastic layer, wherein;
      the graphite sheet has an average thickness of 300 μm or less;
      the elastic layer is formed from an elastic composition containing a polymer matrix and a particulate heat-conducting filler;
      the elastic layer has an average thickness of 10 to 280 μm;
      the heat-conducting filler has an average particle diameter of 50% or less of the average thickness of the elastic layer;
      the elastic composition has a heat-conducting filler content of 30% by volume or more, and the elastic composition has a heat-conducting filler content of less than 15% by volume when the average particle diameter of the heat-conducting filler is 95% or more of the average thickness of the elastic layer; and
      the barrier layer inhibits movement of the polymer matrix towards the graphite sheet within the elastic layer.

2. The heat-radiating sheet according to claim 1, wherein the barrier layer has an average thickness of 10 μm or less.

3. The heat-radiating sheet according to claim 1, wherein the polymer matrix is silicone rubber or polyisobutylene rubber, and the barrier layer is formed from an acrylic-based resin material.

4. The heat-radiating sheet according to claim 1, wherein an aluminum foil layer is provided between the graphite sheet and the barrier layer.

5. The heat-radiating sheet according to claim 1, wherein the graphite sheet has the average thickness of 80 to 130 μm, the elastic layer has the average thickness of 20 to 170 μm, the heat-conducting filler has the average particle diameter of 1 to 45% of the average thickness of the elastic layer, and
the elastic composition has the heat-conducting filler content of 40 to 75% by volume.

6. The heat-radiating sheet according to claim 1, wherein a material of the heat-conducting filler is at least one type selected from aluminum oxide, aluminum hydroxide, boron nitride, aluminum nitride, zinc oxide, silica, mica and zinc white.

7. The heat-radiating sheet according to claim 6, wherein the material of the heat-conducting filler is aluminum oxide.

8. The heat-radiating sheet according to claim 1, wherein the elastic layer has a hardness of 40 or less.

9. The heat-radiating sheet according to claim 8, wherein the elastic layer has a hardness of 30 or less.

10. A heat-radiating structure, comprising:
   a heat-radiating sheet for use with an exothermic body, including:
      a graphite sheet provided on the exothermic body;
      an electrically insulating elastic layer provided on a surface of said graphite sheet in opposition to the exothermic body; and
      a barrier layer provided between the graphite sheet and the elastic layer, wherein;
         the graphite sheet has an average thickness of 300 μm or less;
         the elastic layer is formed from an elastic composition containing a polymer matrix and a particulate heat-conducting filler;
         the elastic layer has an average thickness of 10 to 280 μm;
         the heat-conducting filler has an average particle diameter of 50% or less of the average thickness of the elastic layer;
         the elastic composition has a heat-conducting filler content of 30% by volume or more, and the elastic composition has a heat-conducting filler content of less than 15% by volume when the average particle diameter of the heat-conducting filler is 95% or more of the average thickness of the elastic layer; and
         the barrier layer inhibits movement of the polymer matrix towards the graphite sheet within the elastic layer;
   a case; and
   an exothermic body provided within said case, wherein;
      the heat-radiating sheet is provided on the exothermic body so that the surface of the elastic layer contacts the exothermic body; and
      the case has a volume of free space of less than 20% of the volume of the case.

* * * * *